US012472865B2

(12) United States Patent
Gatsios et al.

(10) Patent No.: US 12,472,865 B2
(45) **Date of Patent: *Nov. 18, 2025**

(54) ILLUMINATION ARRANGEMENT WITH AN ILLUMINATION MODULE AND A PERIPHERAL MODULE CONNECTED TO THE SAME

(71) Applicant: Hella GmbH & Co. KGaA, Lippstadt (DE)

(72) Inventors: Sebastian Gatsios, Arnsberg (DE); Florian Herold, Bielefeld (DE); Dirk Kliebisch, Paderborn (DE); Ingo Moellers, Rietberg (DE); Alexander Schwan, Kamen (DE); Patrick Vogel, Unna (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 153 days.

This patent is subject to a terminal disclaimer.

(21) Appl. No.: 18/326,151

(22) Filed: May 31, 2023

(65) Prior Publication Data

US 2023/0382291 A1 Nov. 30, 2023

(30) Foreign Application Priority Data

May 31, 2022 (DE) ........................ 102022113656.6

(51) Int. Cl.
*B60Q 1/076* (2006.01)
*F21S 41/153* (2018.01)
(Continued)

(52) U.S. Cl.
CPC ........... *B60Q 1/076* (2013.01); *F21S 41/153* (2018.01); *F21S 41/663* (2018.01);
(Continued)

(58) Field of Classification Search
None
See application file for complete search history.

(56) References Cited

U.S. PATENT DOCUMENTS

2002/0159276 A1* 10/2002 Deboy .............. H02M 3/33507 363/20
2019/0197934 A1 6/2019 El Idrissi et al.
2023/0382292 A1* 11/2023 Gatsios ................ B60Q 1/0088

FOREIGN PATENT DOCUMENTS

DE 4031780 A1 4/1992
DE 102019004909 A1 1/2021
DE 102020124960 A1 3/2022

* cited by examiner

*Primary Examiner* — Kenneth B Wells
(74) *Attorney, Agent, or Firm* — Husch Blackwell LLP

(57) ABSTRACT

An illumination arrangement includes a control unit, an illumination module connected to the control unit via a bidirectional first channel that features an LED matrix for generating light, and a peripheral module connected to the illumination module via a second channel. The control unit can be used to generate data for controlling the illumination module and for controlling the peripheral module. The data for controlling the illumination module and data for controlling the peripheral module can be transferred to the illumination module via the first channel. The data for controlling the peripheral module can be transferred from the illumination module to the peripheral module via the second channel. The second channel is a bidirectional channel via which data can be transferred from the peripheral module to the illumination module and, after being received by the illumination module, can be transferred to the control unit via the first channel.

11 Claims, 2 Drawing Sheets

(51) Int. Cl.
*F21S 41/663* (2018.01)
*F21Y 105/16* (2016.01)
*F21Y 113/13* (2016.01)
*F21Y 115/10* (2016.01)

(52) U.S. Cl.
CPC ....... *B60Q 2200/38* (2013.01); *F21Y 2105/16* (2016.08); *F21Y 2113/13* (2016.08); *F21Y 2115/10* (2016.08)

Control unit
1
Microcontroller
11
3
Headlamp
2
Illumination module
22
Peripheral module
23
4
Interface
24
Microcontroller
25
Power unit
26
Power Supply
27

ILLUMINATION ARRANGEMENT WITH AN ILLUMINATION MODULE AND A PERIPHERAL MODULE CONNECTED TO THE SAME

CROSS REFERENCE

This application claims priority to German Application No. 10 2022 113656.6, filed May 31, 2022, the entirety of which is hereby incorporated by reference.

FIELD OF THE INVENTION

The invention relates to an illumination arrangement in particular for a motor vehicle, with a control unit, an illumination module connected to the control unit via a bidirectional first channel that features an LED matrix for generating light, and a peripheral module connected to the illumination module via a second channel. The control unit can be used to generate data for controlling the illumination module and data for controlling the peripheral module. The data for controlling the illumination module and the data for controlling the peripheral module can be transferred to the illumination module via the first channel. The data for controlling the peripheral module can be transferred to the peripheral module via the second channel.

BACKGROUND OF THE INVENTION

The inventors are aware of an illumination arrangement with these features. The data used for controlling the illumination module are essentially data for controlling the LED matrix, with which various light patterns can be generated, in order to generate light with the illumination module. The illumination module can, for example, be part of a front headlamp of a motor vehicle with which various light distributions or light patterns can be generated, for example low beam, high beam, dynamic cornering light, etc. The data for controlling the illumination module are generated in the control unit and transferred to the illumination module via the first channel.

The peripheral module is not connected to the control unit but to the illumination module. The data for controlling the peripheral module is transferred from the illumination module to the peripheral module via a second channel. This data for controlling the peripheral module is not, however, determined in the illumination module. Rather, such data, like the data for controlling the illumination module, is transferred from the control unit to the illumination module via the first channel. From the illumination module, the data for controlling the peripheral module is transferred to the peripheral module via the second channel.

The channel is consequently designed in such a way that not only the data for controlling the illumination module but also the data for controlling the peripheral module can be transferred via the first channel.

The first channel is, as a rule, a bidirectional channel, via which data from the illumination module can also be reported back to the control unit. To date, it has not been possible to send peripheral module data to the control unit. If peripheral module data is sent to the control unit, the simplest solution would be to build up a connection between the peripheral module and the control unit and to select an established bus for the channel built up in this way. However, the inventors were looking for a less elaborate solution.

BRIEF SUMMARY OF THE INVENTION

According to the inventive solution discovered by the inventors, the second channel, via which data is transferred from the peripheral module to the illumination module after it is received by the illumination module from the control unit via the first channel, is a bidirectional channel.

An inventive illumination arrangement can feature a headlamp. The illumination module and the peripheral module can be modules of this headlamp.

The peripheral module can comprise a drive for driving mechanical components of the headlamp. The drive can be a stepper motor, for example a stepper motor for swiveling the illumination module or a cover for shading the light generated by the illumination module.

The peripheral module can be a light matrix manager.

It is possible for the illumination arrangement to feature several peripheral modules.

The data that can be transferred from the peripheral module to the illumination module can be, for example, diagnostic data that provides information on the state of the peripheral module.

The first channel can be conducted via a UART connection, an SPI connection, a 12C connection, a GMSL connection or any other suitable connection. The RGB signal can, however, also be conducted directly via cables and interfaces suitable for RGB signals.

The use of an RGB signal facilitates a direct kind of control by the control unit of the LED matrix of the illumination module. The integration of the data for controlling the peripheral module into the RGB signal facilitates a compressed data transfer. A further channel or division of the first channel using multiplex or similar methods is therefore not required. The bandwidth of the first channel is increased by using the range of the RGB signal not used for the image data, for example the blanking range.

Not only data for controlling the peripheral module can be transferred in the range of the RGB signal not used for the image data. It is also possible for further data for controlling the illumination module to be transferred from the control unit to the illumination module in this range.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION OF THE DRAWINGS

Figure 1:
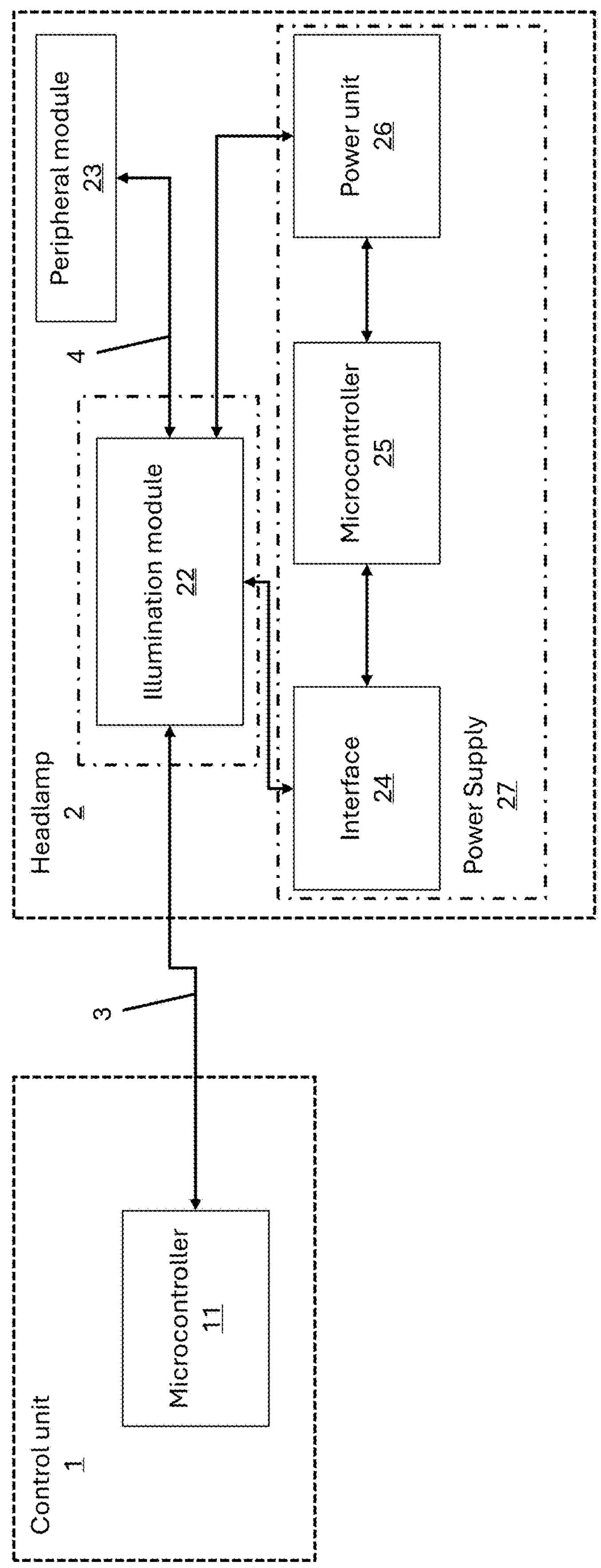
FIG. 1 is a schematic, simplified block diagram of the inventive arrangement.

The inventive illumination arrangement comprises a control unit 1 and a headlamp 2 with an illumination module 22, a power supply 27 for the illumination module 22 and a peripheral module 23, which can be a stepper motor.

The control unit 1 features a microcontroller 11 with which data for controlling the illumination module 22 and for controlling the peripheral module 23 of the headlamp 2 can be generated. This data is transmitted via an interface of the control unit 1 and a cable 3 to an interface of the illumination module 22. A first channel is set up via the interfaces and the cable, via which the data for controlling the illumination module 22 and for controlling the peripheral module 23 can be transferred. The first channel is a bidirectional channel so that it is also possible to transfer data from the illumination module 22 to the control unit 1.

The illumination module 22 takes the form of an SSL chip. It comprises an LED matrix, receives data for controlling the illumination module 22 and for controlling the peripheral module 23. The data for controlling the illumination module 22 is processed by the SSL chip.

A part of the data, namely image information, is processed by the illumination module 22, here the SSL chip, in order to set the desired light pattern or the desired light distribution.

A further part of the data for controlling the illumination module 22 is forwarded to the power supply 27. For this purpose, the illumination module 22, here the SSL chip, has an interface that is connected to an interface 24 of the power supply 27 via a CAN bus. The interface [23] 24 is connected to a microcontroller 25 of the power supply 27 that actuates a power unit 26 of the power supply 27, via which the LED matrix or, as the case may be, individual LEDs of the LED matrix are supplied with power.

Furthermore, the illumination module 22, here the SSL chip, extracts from the data received the data for controlling the peripheral module 23 and makes it available at the interface at which this data is then transferred via a cable 4 to the peripheral module 23. A second channel is set up for this purpose via the interface and the cable.

This second channel is a bidirectional channel so that it is also possible to transfer data from the peripheral module 23 to the illumination module 22. The peripheral module 23 can, for example, feature a diagnostic function with which diagnostic data can be collected. Such diagnostic data can be transferred to the illumination module 22 via the bidirectional second channel. This data can be transferred via the bidirectional first channel from the illumination module 22 to the control unit 1.

A modified RGB signal is transferred via the first channel. Just like every RGB signal, the RGB signal contains control information for generating the image, in the present case the image information for generating the desired light pattern. Alongside this data, the RGB signal, which is a modification of a conventional RGB signal, also contains data for controlling the power supply 27 of the illumination module 22 and for controlling the peripheral module 23. This data is transferred in a range of the RGB signal that is not used for the image information on the light pattern or the light distribution. This is preferentially what is known as the blanking range.

Figure 2:
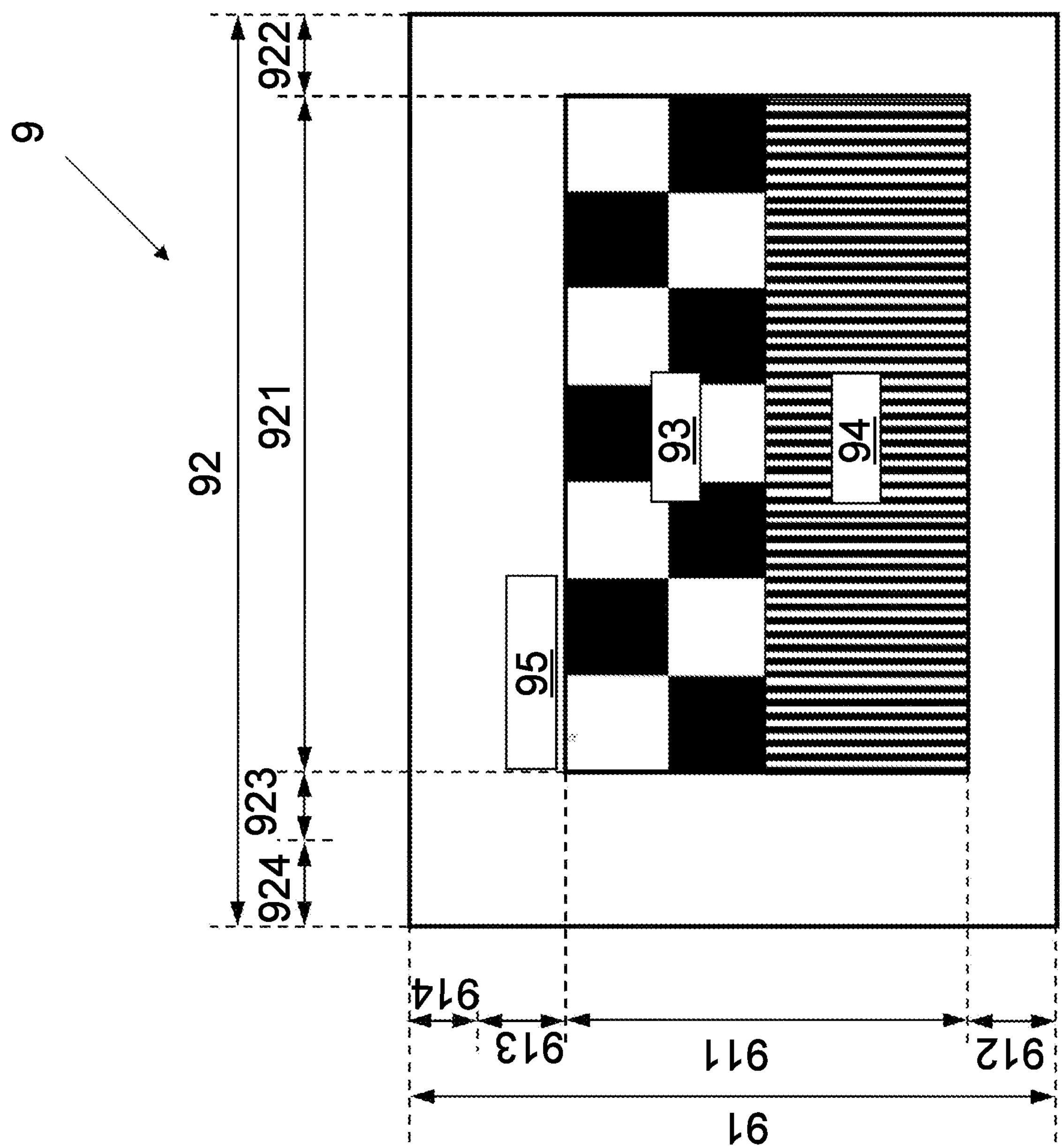
FIG. 2 is a representation of an RGB signal.

FIG. 2 shows the schematic layout of an individual video image 9 RGB signal.

The video image 9 has a total height of 91 and a total width of 92. The total height 91 is subdivided into four ranges 911, 912, 913, 914. The first range designates the active height 911. The first range in the lower range of the image is bordered by the vertical front porch 912 and in the upper range of the image by the vertical back porch 913. Furthermore, a range of the vertical synchronization 914 borders on the vertical back porch 913.

The total width 92 can likewise be subdivided into four ranges 921, 922, 923, 924. The first range designates the active width 921; in the right portion of the image, this is surrounded by the horizontal front porch 922 and in the left portion of the image by the horizontal back porch 923. The horizontal back porch 923 is bordered by a range of the horizontal synchronization 924.

The useful information in the video signal is transmitted in the range spanned by the active height 911 and the active width 921. This range can, in turn, be subdivided into a first video image portion 93 and a second video image portion 94. For each video image portion 93, 94, the luminance values of the individual LEDs of the LED matrix of the SSL chip 22 are coded in 16383 pixels.

The unused range of the video image, the blanking range, is located outside of the range spanned by the active height 911 and the active width 921. This blanking range also includes the vertical back porch 913 in which the data 95 for controlling the power supply and for controlling the peripheral module are transferred.

LIST OF REFERENCE NUMBERS

- 1 Control unit
- 11 Microcontroller
- 2 Headlamp
- 22 SSL chip
- 23 Peripheral module
- 24 Interface
- 25 Microcontroller
- 26 Power unit
- 3 Cable for the first channel
- 4 Cable for the second channel
- 9 Video signal of an RGB image
- 91 Total height
- 911 Active height
- 912 Vertical front porch
- 913 Vertical front porch
- 914 Vertical synchronization
- 92 Total width
- 921 Active width
- 922 Horizontal front porch
- 923 Horizontal front porch
- 924 Horizontal synchronization
- 93 First part video image
- 94 Second part video image
- 95 Range of the range of the RGB signal not used for image data that is used for data to control the power supply and the peripheral module

The invention claimed is:

1. An illumination arrangement comprising:

a control unit, an illumination module connected to the control unit via a bidirectional first channel, wherein the illumination module comprises an LED matrix for generating light, and a peripheral module connected to the illumination module via a second channel, wherein the control unit generates data for controlling the illumination module and data for controlling the peripheral module, wherein the data for controlling the illumination module and the data for controlling the peripheral module are transferred to the illumination module via the first channel, wherein the data for controlling the peripheral module is transferred from the illumination module to the peripheral module via the second channel, wherein the second channel is a bidirectional channel via which data is transferred from the peripheral module to the illumination module and, after being received by the illumination module, is transferred to the control unit via the first channel.

2. The illumination arrangement in accordance with claim 1, further comprising a headlamp, wherein the illumination module and the peripheral module are modules of the headlamp.

3. The illumination arrangement in accordance with claim 2, wherein the peripheral module includes a drive for driving mechanical components of the headlamp.

4. The illumination arrangement in accordance with claim 3, wherein lighting technology properties of the illumination module are manipulable.

5. The illumination arrangement in accordance with claim 2, wherein the peripheral module is a light matrix manager or an IC for controlling light functions.

6. The illumination arrangement in accordance with claim 1, wherein the data transferred from the peripheral module to the illumination module are diagnostic data that show the state of the peripheral module.

7. The illumination arrangement in accordance with claim 1, wherein the first channel is conducted via a UART connection, SPI connection, a 12C connection, or a GMSL connection.

8. The illumination arrangement in accordance with claim 1, wherein an RGB signal is generated by the control unit for generating a light pattern by the illumination module and is transferred via the first channel to the illumination module, where image data of the RGB signal are the data for controlling the illumination module or form part of the data for controlling the illumination module.

9. The illumination arrangement in accordance with claim 1, wherein an RGB signal is generated by the control unit for generating a light pattern by the illumination module and is transferred via the first channel to the illumination module, where control data of the RGB signal are the data for controlling the peripheral module or form part of the data for controlling the peripheral module.

10. The illumination arrangement in accordance with claim 8, wherein the RGB signal has a range not used for image data.

11. The illumination arrangement in accordance with claim 9, wherein the RGB signal has a range not used for image data.

* * * * *